United States Patent
Boerner

(10) Patent No.: US 8,508,122 B2
(45) Date of Patent: Aug. 13, 2013

(54) ORGANIC ELECTROLUMINESCENT DEVICE

(75) Inventor: Herbert F. Boerner, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/146,935

(22) PCT Filed: Jan. 27, 2010

(86) PCT No.: PCT/IB2010/050350
§ 371 (c)(1),
(2), (4) Date: Jul. 29, 2011

(87) PCT Pub. No.: WO2010/089678
PCT Pub. Date: Aug. 12, 2010

(65) Prior Publication Data
US 2011/0279027 A1    Nov. 17, 2011

(30) Foreign Application Priority Data

Feb. 5, 2009  (EP) ..................................... 09152169
Feb. 5, 2009  (EP) ..................................... 09152170
Apr. 23, 2009  (EP) ..................................... 09158639

(51) Int. Cl.
*H05B 33/04*    (2006.01)

(52) U.S. Cl.
USPC .............................. 313/504; 313/512; 445/25

(58) Field of Classification Search
USPC ...................... 313/504, 512; 445/25; 438/99; 257/98, 100, 40
See application file for complete search history.

(56) References Cited

U.S. PATENT DOCUMENTS

| 5,804,917 A * | 9/1998 | Takahashi et al. ............ 313/504 |
| 6,580,212 B2 * | 6/2003 | Friend ........................... 313/504 |
| 2002/0190650 A1 * | 12/2002 | Kawanami et al. .......... 313/586 |
| 2006/0102463 A1 | 5/2006 | Cok |
| 2007/0114523 A1 | 5/2007 | Oumi et al. |
| 2007/0128765 A1 | 6/2007 | Auch et al. |
| 2008/0297045 A1 | 12/2008 | Cok |

FOREIGN PATENT DOCUMENTS

| GB | 2400235 A1 | 10/2004 |
| GB | 2419023 A | 4/2006 |
| JP | 2008010402 A | 1/2008 |
| KR | 648167 B1 | 11/2006 |
| KR | 660014 B1 | 12/2006 |
| WO | 2004107467 A2 | 12/2004 |
| WO | 2009001241 A1 | 12/2008 |

* cited by examiner

*Primary Examiner* — Mary Ellen Bowman
(74) *Attorney, Agent, or Firm* — David Zivan; Mark Beloborodov

(57) ABSTRACT

The present invention relates to an organic electroluminescent device comprising a substrate (40) and on top of the substrate (40) a substrate electrode (20), a counter electrode (30) and an electroluminescent layer stack (50) with at least one organic electroluminescent layer arranged between the substrate electrode (20) and the counter electrode (30), an encapsulation means (90) encapsulating at least the electroluminescent layer stack (50) and at least one non-conductive spacer means (70) arranged on the substrate electrode (20) to mechanically support the encapsulation means (90) and to prevent an electrical short between the substrate electrode (20) and the counter electrode (30) during the mechanical support, wherein the spacer means (70) comprise at least one light scattering means (80) for redirecting at least a part of light (65) trapped in the substrate (40), to a method of manufacturing such an encapsulated electroluminescent device and to the use of an array, preferably a hexagonal array, of non-conductive spacer means.

12 Claims, 4 Drawing Sheets

ORGANIC ELECTROLUMINESCENT DEVICE

FIELD OF THE INVENTION

The present invention relates to an organic electroluminescent device encapsulated by an encapsulation means, a method of manufacturing such an encapsulated electroluminescent device and the use of an array of almost invisible spacer means to support the electroluminescent device.

BACKGROUND OF THE INVENTION

Common organic electroluminescent devices (OLEDs) comprise a functional layer stack on top of a substrate with at least one organic electroluminescent layer sandwiched between a substrate and a counter electrode, whereas parts of the electroluminescent layer and/or parts of the counter electrode are sensitive to water and/or oxygen. Therefore OLEDs are encapsulated by cover lids to prevent ambient substance such as water and oxygen from reaching the functional layers, to provide OLED devices having a sufficient lifetime. The cover lid defines an encapsulated volume around the functional layer stack with typically a gap or space between the outermost layer of the functional layer stack and the inner side of the cover lid. This gap or space may be filled with inert gas, e.g. dry nitrogen.

A problem of OLEDs encapsulated with a cover lid is the mechanical stability of this encapsulation. Pressure differences in the surrounding environment may give rise to substantially deformations in the cover lid, especially in case of large area OLED devices. The deformations of the cover lid may be so high, that the cover lid touches the functional layer stack of the OLED device causing failures, e.g. shorts, of the OLED device.

Document WO2009001241 discloses an OLED encapsulated with a cover lid comprising shunting structures forming a grid of linear non-transparent metallic stripes to obtain a more homogeneous voltage distribution across the substrate electrode, where each metallic strip extends over the complete lengths of the substrate electrode. Each shunting stripe is completely covered by a smooth non-conductive structure to facilitate the formation of a continuous organic layer and counter electrode layer thereon. The resulting grid of non-conductive structures on top of the shunting structures simultaneously serves as spacer structures preventing electrical shorts between the counter electrode and the substrate electrode as a result of mechanical contact between the lid and the functional layer stack. However, the OLED area covered by the spacer structures and non-transparent shunting structures does not emit light and thus is visible as a disturbing grid of black lines. The presence of black lines prevents a homogeneous brightness distribution over the whole light emitting area of the OLED device.

SUMMARY OF THE INVENTION

It is an object of the present invention to provide an organic electroluminescent device with a spacer structure preventing electrical shorts between both electrode as a result of mechanical contact between the cover lid and the functional layer stack with a more homogeneous brightness distribution and an improved light emission.

This object is solved by an electroluminescent device comprising a substrate and on top of the substrate a substrate electrode, a counter electrode and an electroluminescent layer stack with at least one organic electroluminescent layer arranged between the substrate electrode and the counter electrode, an encapsulation means encapsulating at least the electroluminescent layer stack and at least one non-conductive spacer means arranged on the substrate electrode to mechanically support the encapsulation means and to prevent an electrical short between the substrate electrode and the counter electrode during the mechanical support, wherein the spacer means comprise at least one light scattering means for redirecting at least a part of light trapped in the substrate.

The leading idea of the present invention is to make the spacer means, which provide mechanical support to the encapsulation means, less visible, preferably invisible, for the viewer of the electroluminescent device by redirecting light trapped in the substrate from the area covered by the spacer means towards the substrate surface in order to couple out at least a part of the trapped light to the environment from areas covered by the spacer means. The spacer means itself may be transparent or opaque. The area to which the non-conductive spacer means is applied may appear dark at normal operation of the electroluminescent device, since charge injection from the substrate electrode to the electroluminescent layer stack is blocked. The spacer means comprises light scattering means for scattering light generated by the organic electroluminescent layer. The light scattering means may comprise light scattering particles and/or flakes embedded in the spacer means. This light scattering means scatters and or reflects part of the artificial light guided inside the substrate. This results in a brightening of the otherwise non-emissive area. As the substrate often works as a kind of light guide, the scattering means of the protective means enables this light to be scattered and reflected out of the electroluminescent device. The resulting electroluminescent device (OLED) shows a more homogeneous brightness distribution. The scattering properties together with the size of the substrate electrode area covered by each spacer means can be adapted to achieve a homogeneous brightness distribution with almost invisible spacer means. Less visible or invisible spacer means can support the encapsulation means more effective, because the number of spacer means, preferably spacer means covering small areas, may be adapted (increased) to the size and shape of the encapsulation means without disturbing the visual appearance (homogeneous brightness) of the electroluminescent device.

In the context of the invention the notion electroluminescent (EL) layer stack denotes all layers prepared between the substrate electrode and the counter electrode. In one embodiment of an EL layer stack, it comprises at least one light emitting organic electroluminescent layer prepared between substrate and counter electrode. In other embodiments the layer stacks may comprise several layers prepared between substrate and counter electrode. The several layers may be organic layers, such as one or more hole transport layers, electron blocking layers, electron transport layers, hole blocking layers, emitter layers or a combination of organic and non-organic layers. The non-organic layers may be additional electrodes in case of two or more light emitting layers within the layer stack and/or charge injection layers. In a preferred embodiment the substrate electrode and or the counter electrode comprise at least one of the following materials: ITO, aluminum, silver, doped ZnO or an oxide layer.

In the context of the invention the notion substrate denotes a base material onto which the different layers of an electroluminescent device are deposited. Normally, the substrate is transparent and is made of glass. Furthermore, it may be preferable that the substrate is transparent, preferably comprising at least one of the following materials: silver, gold, glasses or ceramics. It may also be a transparent polymer sheets or foils with a suitable moisture and oxygen barrier to essentially prevent moisture and/or oxygen entering the electroluminescent device layer stack. It is also possible to use non-transparent materials like metal foils as substrate. The substrate may comprise further layers, e.g. for optical purposes like light out-coupling enhancement or other purposes. The substrate is usually flat, but it may also be shaped into any three-dimensional shape that is desired.

In the context of the invention the notion substrate electrode denotes an electrode deposited on top of the substrate. Usually it consists of transparent ITO (Indium-Tin oxide) optionally with an undercoating of $SiO_2$ or SiO to suppress diffusion of mobile atoms or ions from the glass into the electrode. For a glass substrate with an ITO electrode, the ITO is usually the anode, but in special cases it can also be used as the cathode. In some cases, thin Ag or Au layers (8-15 nm thick) are used single or in combination with ITO as the substrate electrode. If a metal foil is used as the substrate, it takes also the role of the substrate electrode, either anode or cathode. The notation on-top-of denoted the sequence of the listed layers. This notation explicitly comprises the possibility of further layers in between the layer denoted as on top of each other. For example, there might be additional optical layers to enhance the light out-coupling arranged between substrate electrode and substrate.

In the context of the invention the notion counter electrode denotes an electrode away from the substrate. It is usually non-transparent and made of Al or Ag layers of sufficient thickness such that the electrode is reflecting (typically 100 nm for Al and 100-200 nm for Ag). It is usually the cathode, but it can also be biased as the anode. For top-emitting or transparent electroluminescent devices the counter electrode has to be transparent. Transparent counter electrodes are made of thin Ag or Al layers (5-15 nm) or of ITO layers deposited on top of the other previously deposited layers.

In the context of the invention an electroluminescent device with a combination of a transparent substrate, a transparent substrate electrode and a non-transparent counter electrode (usually reflective), emitting the light through the substrate is called "bottom-emitting". In case of electroluminescent device comprising further electrodes, in certain embodiments both substrate and counter electrodes could be both either anodes or cathodes, when the inner electrodes as driven as cathodes or anodes. Furthermore, in the context of the invention an electroluminescent device with a combination of a non-transparent substrate electrode and a transparent counter electrode, emitting the light through the counter electrode is called "top-emitting".

In the context of the invention the notion transparent electroluminescent device denotes an electroluminescent device, where the substrate, the substrate electrode, the counter electrode and the encapsulation means are transparent. Here the electroluminescent device is both, bottom and top-emitting. In the context of the invention a layer, substrate or electrode is called transparent if the transmission of light in the visible range is more than 50%; the rest being absorbed or reflected. Furthermore, in the context of the invention a layer, substrate or electrode is called semi-transparent if the transmission of light in the visible range is between 10% and 50%; the rest being absorbed or reflected. In addition, in the context of the invention light is called visible light, when it possesses a wavelength between 450 nm and 650 nm. In the context of the invention light is called artificial light, when it is emitted by the organic electroluminescent layer of the electroluminescent device.

Furthermore, in the context of the invention a layer, connector or construction element of an electroluminescent device is called electrically conducting if its electrical resistance is less than 100000 Ohm. In the context of the invention passive electronic components comprise resistors, capacitors and inductivities. Furthermore, in the context of the invention active electronic components comprise diodes, transistors and all types of integrated circuits.

In the context of the invention a layer, substrate, electrode or a construction element of an electroluminescent device is called reflective if light incident on its interface is returned according to the law of reflection: the macroscopic angle of incidence equals the macroscopic angle of reflection. Also the term specular reflection is used in this case. Furthermore, in the context of the invention a layer, substrate, electrode or a construction element of an electroluminescent device is called scattering if light incident on it is not returned according to the law of reflection: macroscopic angle of incidence is not equal to the macroscopic angle of the returned light. There is also a distribution of angles for the returned light. Instead of scattering, the term diffuse reflection is also used.

In the context of this invention the encapsulation means encapsulates at least the electroluminescent layer stack. The encapsulation means may also encapsulate the whole stack of layers of the electroluminescent device or just a plurality of layers, forming a part of the whole stack of layers. Preferably, the encapsulation means is a gas-tight element, covering at least the organic electroluminescent layer and the counter electrode. By using a gas-tight encapsulation means, it is prevented that environmental factors like water, or oxygen can damage the encapsulated layers. The encapsulation means may form a gas-tight lid. This lid may be formed of glass or metal. It is also possible to form the encapsulation means by one or a plurality of layers applied to the electroluminescent device or just parts of it. The layers may comprise silicon, silicon oxide, silicon nitride, aluminum oxide or silicon oxinitride. All the named encapsulation means prevent mechanical and/or environmental factors from affecting the layer stack of the electroluminescent device adversely. Additional getter materials may be arranged inside the encapsulated volume, preferably attached to the inner side of the encapsulation means, to further reduce the amount of water and/or oxygen inside the encapsulated device. As an example, the encapsulation means can be made of metals, glass, ceramics or combinations of these. It is attached to the substrate by conductive or non-conductive glue, melted glass frit or metal solder.

In an embodiment the sum of all areas covered by spacer means on top of the substrate electrode is significantly smaller than the area covered by the electroluminescent layer stack, preferably less than 10% of the area covered by the electroluminescent layer stack, more preferably less than 5% of the area covered by the electroluminescent layer stack, even more preferably less than 1% of the area covered by the electroluminescent layer stack. From areas covered by non-conductive spacer means no current is injected into the electroluminescent layer stack preventing the generation of light within the electroluminescent layer stack on top of the spacer means. A smaller sum of all areas (=total area) covered by spacer means improves the total brightness of the electroluminescent device, because the active area of the electroluminescent layer generating light is larger. In a preferred embodiment the largest extension of the area covered by the spacer means is significantly smaller than each of the lateral extensions of the area covered by the electroluminescent layer stack, preferably less than 10% of each of the lateral extensions of the area covered by the electroluminescent layer stack, more preferably less than 5% of each of the lateral extensions of the area covered by the electroluminescent layer stack, even more preferably less than 1% of each of the lateral extensions of the area covered by the electroluminescent layer stack. The extension of the area covered by the spacer means denotes the distance two points at the outer edge of area of the spacer means. The largest extension is the maximum possible distance between such two points. As an example, the largest extension of a circle-like area is the diameter of this area. A number of small spacer means occupying a corresponding small area on top of the substrate electrode will provide at least the same sufficient support to the encapsulation means compared to a lower number of spacer means occupying a larger area per spacer means. However, it is much easier to make the spacer means with smaller lateral extension less visible, preferably non-visible, by adding scattering particles, because the required scattering effect to achieve a more homogeneous brightness, preferably a homogeneous brightness, of the OLED device is easier to be adjusted for a area with smaller lateral extensions. As an example, s small covered area with a large extension in one dimension may be still visible as a thin dark line compared to the bright surrounding areas, while the same small area with a shape with small lateral extension in both dimensions can be made lesser visible or even invisible.

In another embodiment the electroluminescent device comprises an array of spacer means, preferably a regular array, more preferred a hexagonal array. An array of spacer means will provide a more secure support to the encapsulation means compared to a single spacer means, as an example located somewhere in the middle of the light emitting area. A non-visible array of spacer means can be achieved easier with a regular array, most easy with a hexagonal array, which to the human eye is less visible than other arrays.

In another embodiment the height of the spacer means ranges between 5 and 1000 micrometer, preferably between 10 and 500 micrometer, more preferred between 10 and 200 micrometer, even more preferred between 10 and 100 micrometer, to provide sufficient support to the encapsulation means. The layer stack on top of the substrate electrode comprising electroluminescent layer stack and counter electrode has a typical thickness of 200-300 nm. The encapsulation means has to be fixed to the substrate electrode in a gas-tight manner with suitable fixation means, e.g. glue, glass frit, or metallic solder, having a height of at least a few micrometers. To provide a sufficient support of the encapsulation means require spacer means of heights at least in the micrometer range.

It is advantageous to use an encapsulation means with a gap between substrate electrode and inner side of the encapsulation means in the range between a few micrometers and a few hundreds of micrometers in order to achieve a thin electroluminescent device, where simultaneously the spacer means with heights comparable to said gap prevent the encapsulation means from touching the counter electrode somewhere between the spacer means and protect the counter electrode from getting into electrical contact with the substrate electrode in case of mechanical contacts between encapsulation means and counter electrode above the spacer means. To fulfill these tasks, the spacer means must be thick and hard enough. The precise thickness and hardness depend on the actual pressure exerted by the encapsulation means and the present gap between encapsulation means and substrate electrode. In a preferred embodiment the height of the spacer means is adapted to be essentially the same as the distance between the counter electrode and the inner side of the encapsulation means as present outside the area covered with spacer means, preferably the encapsulation means is a flat lid. People skilled in the art are able to choose the required thickness of the spacer means within the scope of this invention depending on the layer thicknesses and the geometrical shape of the encapsulation means. In this embodiment, the spacer means not only prevent electrical contacts between both electrodes but also provide a strong mechanical support to the encapsulation means by carrying the encapsulation means. Here the encapsulation means may be manufactured from more fragile material or thinner material, e.g. thin glass back plates sealed to the substrate with glass frit, glue or metallic solder.

In another embodiment the spacer means comprises at least one of the following materials: non-conductive glue, a photo resist, a lacquer, paint or a layer of glass, made of re-melted glass frit or combinations thereof. The spacer means has to simultaneously mechanically support the encapsulation means and to prevent the direct contact between the counter electrode and the substrate electrode, which would lead to a short. The named materials provide the required hardness to support the encapsulation means to protect the substrate electrode and can easily be applied to the substrate electrode, often without the need of a vacuum chamber. Therefore, the application of the spacer means can be done easily and economically. People skilled in the art may choose other electrically non-conductive materials within the scope of this invention. Non-conductive glue has the advantage, that it is easy to apply and will not damage the substrate electrode. Non-conductive glue is mostly a viscous fluid, which can easily be attached to the substrate electrode. Furthermore, it can be applied at ambient pressure and there is no need to use a vacuum chamber. Therefore, a drop of non-conductive glue can easily be applied to the substrate electrode and prevent as a spacer means any short between the two electrodes. To achieve lasting non-conductive glue at least one of the following matrices may be used: epoxys, polyurethanes, acrylic or silicone.

Preferably the non-conductive glue of the spacer means is anhydrous and/or water free. In the context of the invention, the notion water free and/or anhydrous describes the fact, that no degradation due to water content during the average lifetime of an electroluminescent device can be observed by the naked eye. A visible degradation of the organic electroluminescent layer due to water diffusing into the layer stack can take the form of growing black spots or shrinkage of the emissive region from the edges. The notion water free and/or anhydrous not only depends on the non-conductive glue itself but also on the amount of water, which can be absorbed by the organic electroluminescent layer without damaging it. A diffusion is denoted as harmful if a significant life-time reduction of the emitted light can be observed. Standard OLED devices according to state of the art achieve shelf life times in the order of 100000 hours or more. A significant reduction denotes a reduced life-time of about a factor of 2 or more.

In another embodiment the spacer means has a shape suitable to prevent the emergence of a shadowing edge on a substrate electrode. The preferred deposition technology for the organic layers and the counter electrode on top of the spacer means is vacuum evaporation. Vacuum evaporation is a deposition technology, where the materials to be deposited follow a straight path from the evaporation source to the substrate, leading to a directed deposition. If the spacer means has steep edges or overhanging edges, shadowing effects will occur, which lead to holes in the organic layers and the counter electrode. To prevent this undesirable effect, it is preferable that the spacer means has smooth and non-steep edges. As an example, a material property preventing the emergence of a shadowing edge is the viscosity, e.g. the viscosity at enhanced temperature. Preferably the viscosity of the materials of the spacer means is low. If non-conductive glue is used as spacer means it may be applied like a drop onto the substrate electrode. If this non-conductive glue has a viscosity that enables it to flow, a smooth hill-like shape of the spacer means will result, which prevents shadowing effects. If a material is used for the spacer means that gives rise to steep edges that may create shadowing effects if only one deposition source is used, several deposition sources could be used to deposit material from different directions onto the substrate. It may also be advisable to rotate or otherwise move the substrate during deposition to ensure a continuous layer deposition over the spacer means.

In another embodiment the scattering means are pigments and/or flakes and/or particles embedded in the spacer means, preferably aluminum flakes, mica effect pigments or titan dioxide particles. The light scattering means may be also other flakes or particles known to a person skilled in the art to scatter and/or reflect the artificial light of the organic electroluminescent device within the scope of this invention.

In another embodiment at least one electrically conductive contact means is arranged on top of the counter electrode covering an area fully above the area of the spacer means suitable to provide an electrical connection between the counter electrode and a power source through the encapsulation means, which is partly conductive or comprises at least one electrical feed through suitable to connect the counter electrode with the power source. This electrical connection between the contact means and the encapsulation means may be direct or indirect. In a preferred embodiment the contact means is at least one element of the group of conductive glue, spring, arc-shaped spring, rounded tip, pin or combinations thereof. In a preferred embodiment the conductive glue is anhydrous and/or water free.

As an example of a direct connection, the encapsulation means has direct contact with the conductive glue as the contact means. As an example of an indirect connection, a means like a wire may be used to connect the encapsulation means and the conductive glue as the contact means. Apart from the named wire other means may be used to connect the encapsulation means and the contact means, which are known to a person skilled in the art. It is possible to connect the electroluminescent device to an electrical source with the help of the encapsulation means. Therefore, a wire etc. may be attached to the encapsulation means, which transfers the electrical current via the conductive glue of the contact means to the counter electrode. Therefore the encapsulation means has to be conductive at least in some parts. To prevent shorts, the encapsulation means has then to be insulated against the substrate electrode. For example the encapsulation means may comprises an electrically conductive gas-tight feed through. This gas-tight feed through comprises a conductive element, which is directly or indirectly connected to the contact means. If the encapsulation means is electrically conductive and connected to the substrate electrode it is preferred that the gas-tight feed through is electrically insulated against the encapsulation means. This may be done by an insulation means in which the conductive element is embedded. This insulation means for the gas-tight feed through may for example be formed by glass or ceramic, encasing the conductive element.

Alternatively the encapsulation means comprises an electrically conductive contact area. Here, the encapsulation means consists of two different elements, one forming the contact area and another one forming an insulating area. Preferably, the contact area is arranged on top of the encapsulation means. Alternative, the contact area may be formed by an element embedded in the encapsulation means, wherein this embedded element is conductive. For example a metal disk may be embedded in a gas-tight multilayer structure, forming the encapsulation means. This metal disk then forms the contact area, which is in electrical contact with the contact means of the electroluminescent device. Preferably, the contact area is electrically insulated against the encapsulation means. This may be done by embedding the contact area in glass or ceramic or another material known to a person skilled in the art.

The invention further relates to a method to provide an electroluminescent device according to the present invention comprising the steps of depositing at least one spacer means, preferably a suitable number of spacer means, with a height adapted to mechanically support the encapsulation means comprising light scattering means on top of the substrate electrode, depositing the electroluminescent layer stack on top of the substrate electrode and the spacer means, depositing the counter electrode on top of the electroluminescent layer stack, and encapsulating at least the electroluminescent layer stack with the encapsulation means.

The suitable number of spacer means depends on size and material of the encapsulation means. To prevent the encapsulation means from touching the counter electrode in areas with no spacer means underneath, the number of spacer means and the distance between adjacent spacer means have to be adapted to the area size of the encapsulation means and the light emitting layer stack. A larger area size requires a higher number of spacer means. Typically, for a 0.7 mm thick glass cover plate, spacers should be applied every 20 mm. The height of the spacer means will be adapted to the distance between substrate electrode and inner side of the encapsulation means and the thicknesses of electroluminescent layer stack and counter electrode. The most reliable support of the encapsulation means will be achieved by spacer means with heights of essentially equal to the distance between substrate electrode and encapsulation means minus the layer thicknesses of electroluminescent layer stack and counter electrode prepared on top of the spacer means.

Another embodiment of the method comprising the further step of depositing a contact means, preferably a conductive glue, covering an area fully above the area of the spacer means on top of the counter electrode to provide an electrical connection between the counter electrode and a power source through the encapsulation means before applying the step of encapsulating with an encapsulation means, which is partly conductive or comprises at least one electrical feed through suitable to connect the counter electrode with the power source. The conductive means may provide a direct or indirect electrical contact to the corresponding at least partly conductive encapsulation means. Preferably, the contact means is conductive glue and fills the small gap between the counter electrode above the spacer means and the inner side of the encapsulation means to provide a direct electrical contact to the encapsulation means.

The invention further relates to the use of an array, preferably a hexagonal array, of non-conductive spacer means on top of the substrate electrode for an electroluminescent device with a substrate and an encapsulation means for supporting the encapsulating means, where the spacer means comprise light scattering means for redirecting at least a part of the light trapped in the substrate providing a reliable electroluminescent device with more homogeneous brightness distribution and an improved light emission.

The aforementioned electroluminescent device and/or method, as well as claimed components and the components to be used in accordance with the invention in the described embodiments are not subject to any special exceptions with respect to size, shape, material selection. Technical concepts such that the selection criteria are known in the pertinent field can be applied without limitations. Additional details, characteristics and advantages of the object of the present invention are disclosed in the dependent claims and the following description of the respective figures—which are an exemplary fashion only—showing a plurality of preferred embodiments of the electroluminescent device according to the present invention.

BRIEF DESCRIPTION OF THE DRAWINGS

Further embodiments of the invention will be described with respect to the following figures, which show.

DETAILED DESCRIPTION OF EMBODIMENTS

Figure 1:
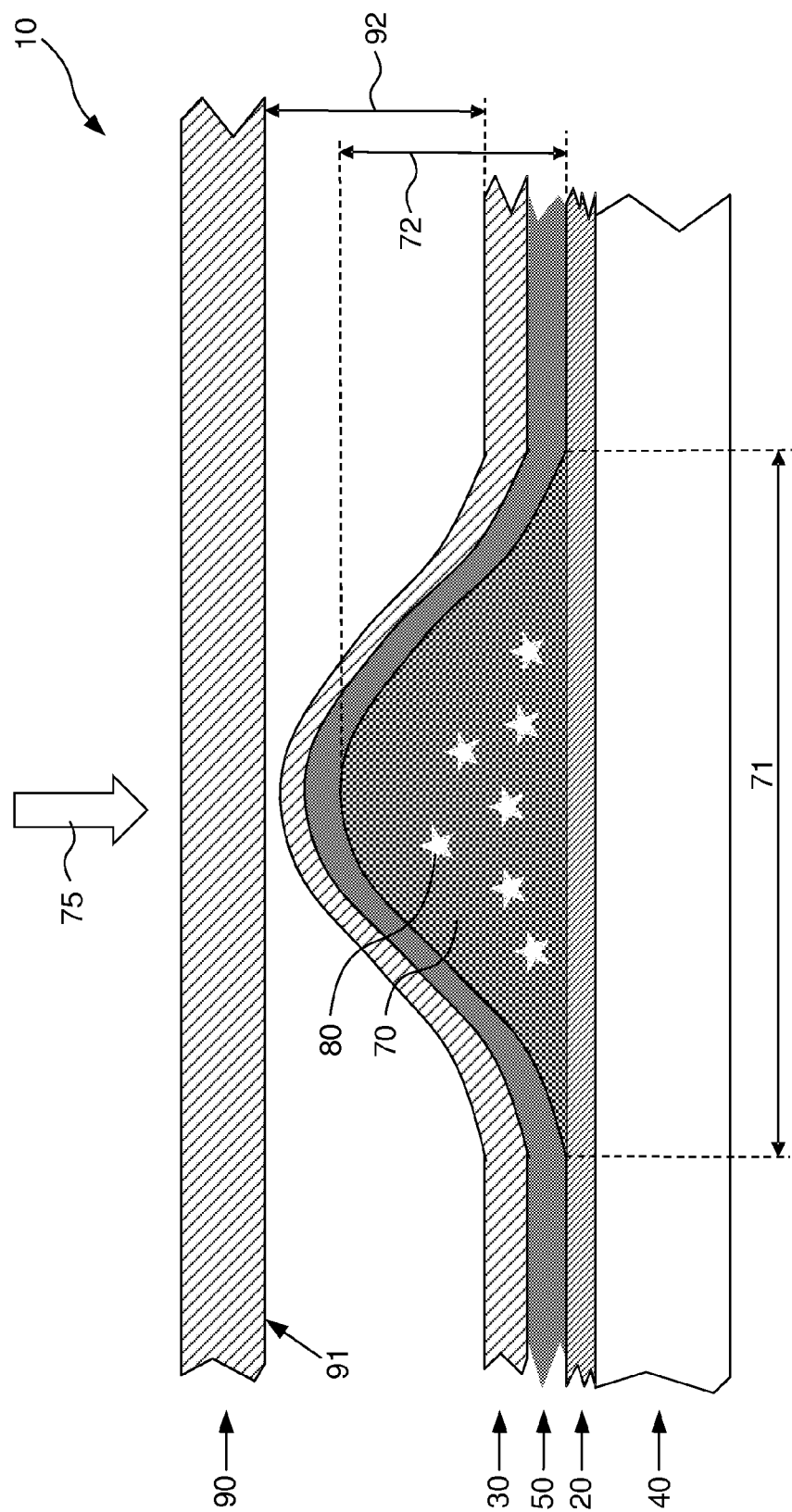
FIG. 1: a side view of an electroluminescent device according to the invention.

FIG. 1 shows an electroluminescent device 10 (OLED) according to the present invention comprising a substrate 40 and on top of the substrate a substrate electrode 20, a counter electrode 30, an electroluminescent layer stack 50 and an encapsulation means 90. The electroluminescent layer stack 50 is arranged between the substrate electrode 20 and the counter electrode 30 comprising at least one organic light emitting layer. The electroluminescent layer stack has a thickness of typically 100-200 nm. The substrate electrode 20 is formed by an approximately 100 nm thick layer of ITO, which is a transparent and conductive material. On top of the substrate electrode 20 a spacer means 70 comprising scattering particles as the scattering means 80. For example the scattering particles 80 may be Aluminum particles with diameters of about 1 micrometer. Onto the substrate electrode 20 and the spacer means 70, the organic electroluminescent layer 50 and subsequently the counter electrode 30 are deposited. If a voltage is applied between the substrate electrode 20 and the counter electrode 30 some of the organic molecules within the organic electroluminescent layer 50 are exited, resulting in the emission of artificial light, which is emitted by the electroluminescent layer 50. The counter electrode 30 is formed by a layer of aluminum of typically 100 nm thickness, working as a mirror reflecting the artificial light through the substrate electrode 20 and the substrate 40. To emit light into the surrounding, the substrate 40 in this embodiment is made of glass. Thus, the electroluminescence device according to FIG. 1 is a bottom emitting OLED. In case of a transparent counter electrode, e.g. made of transparent ITO or a thin Ag or Au layer, the electroluminescent device may be arranged as a top or transparent emitter using a glass plate as the encapsulation means. The electroluminescent device 10 shown in the following figures as well as its components and the components used in accordance with the invention are not shown true to the scale. Especially the thickness of the electrodes 20, 30, organic electroluminescent layer stack 50, the substrate 40 and the spacer means 70 are not true to the scale. All figures just serve to clarify the invention.

If the encapsulation means 90 touches the counter electrode 30 as a result of an applied force 75 to the encapsulation means 90, e.g. due to an increased atmosphere pressure or other mechanical forces like touching the backside of the OLED with fingers or tools, the height 72 of the spacer means, being significantly larger than the total thickness of the layers prepared on top of the substrate electrode, limits the area of the counter electrode touched by the encapsulation means 90 to the areas of the counter electrode covering the spacer means 70. The electrically non-conductive spacer means 70 arranged between both electrodes prevent any electrical contact between counter electrode 30 and substrate electrode 20. The area 71 on the substrate electrode 20 covered by the spacer means 70 (electrically protected area) exceeds the area on the counter electrode 30 being in contact with the encapsulation means 90 (support area). The spacer means 70 isolates the substrate electrode 20 from the counter electrode 30 and any parts of the counter electrode 30, which may be damaged by a mechanical contact with the encapsulation means 90 and may penetrate the organic electroluminescent layer 50, but will not be in any contact to the substrate electrode 20. To provide a mechanical support to the encapsulation means preventing larger movements of the encapsulation means towards the layer stack, the height of the spacer means 72 may be adapted to be essentially the same as the distance 92 between the counter electrode 30 and the inner side 92 of the encapsulation means 90 as present outside the area covered with spacer means, preferably the encapsulation means 90 is a flat lid.

The spacer means 70 has to have material properties and/or application procedure that prevents the emergence of a shadowing edge on the substrate electrode 20. In a preferred embodiment the material property is low viscosity. Therefore, the material forming the spacer means will flow on the substrate electrode 20, forming a hill-like structure with smooth slopes. There will be no shadow edges, which could disturb a continuous coverage of the organic electroluminescence layer 50 and the counter electrode 30, especially the electroluminescent layer stack 50 and the counter electrode 30 can be prepared without cracks, voids or other defects in the area around the spacer means 70. The spacer means 70 preferably has a lower viscosity at enhanced temperature that enables a two step application. In a first step the material forming the spacer means—like non-conductive glue—is applied to the substrate electrode 20 in the desired position. Then the substrate is heated to an enhanced temperature. Due to its lower viscosity, the material of the spacer means 70 will then flow out on the substrate electrode 20. Preferably the material of the spacer means 70 comprises a viscosity that enables it to flow slowly, to form a spacer means 70 with a defined height and smooth slopes. As the temperature of the spacer means and/or the material of the spacer means decreases, it should solidify, to form the spacer means 70. This ability and/or material property of the spacer means 70 to flow onto the substrate electrode 20 in such a way, that no shadowing edges are formed enables the manufacturing of the disclosed electroluminescence device 10

Figure 2:
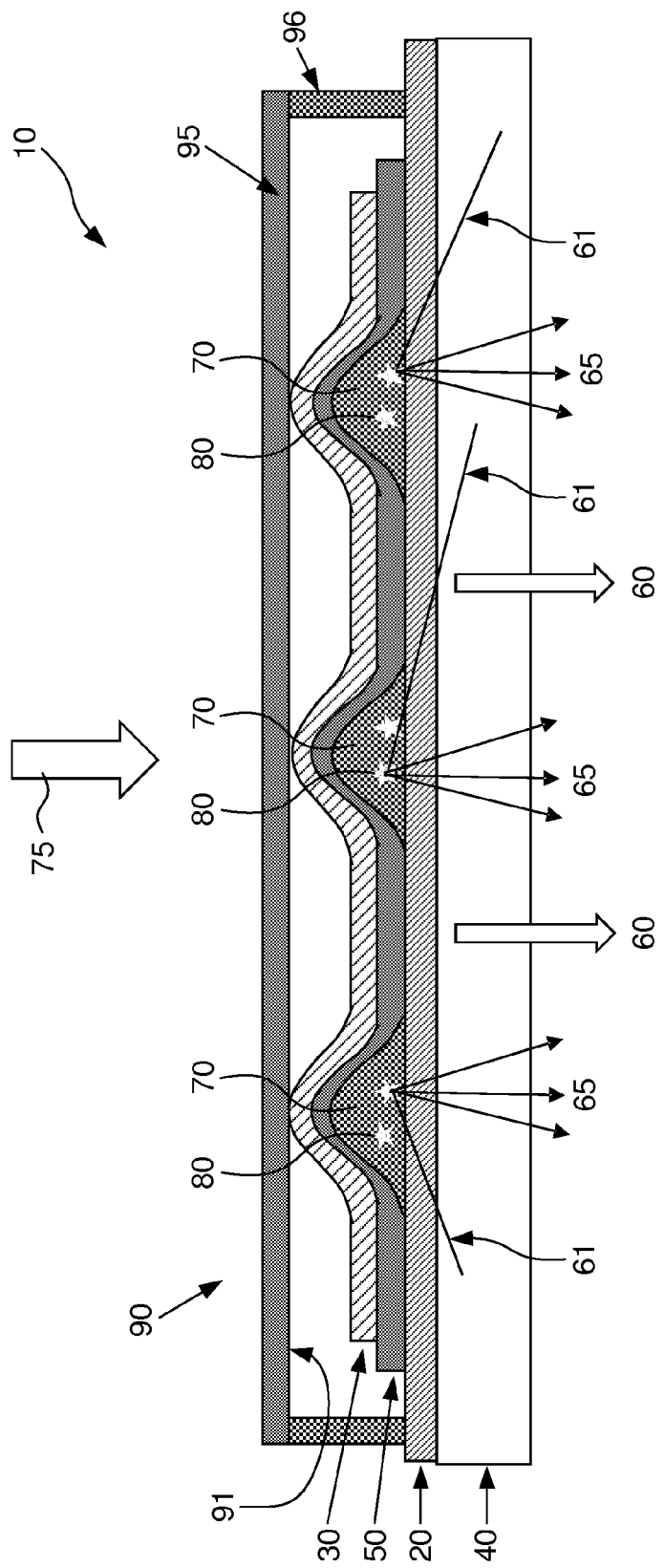
FIG. 2: a side view of an electroluminescent device according to the invention comprising an array of spacer means redirecting light.

FIG. 2 shows an encapsulated electroluminescent device 10 according to the present invention. A driving voltage will be applied to the electroluminescent device between the areas of the substrate electrode not covered with spacer means 70 and the counter electrode leading to light generation in the electroluminescent layer stack 50 and subsequently leading to the emission of light 60 from these areas between the spacer means 70. Due to the optical properties of the electroluminescent layer stack, substrate electrode and substrate, a major part of the generated light will not be coupled out to the environment but is trapped within the substrate as trapped light 61. The scattering means 80 embedded in the spacer means 70 redirects a significant part of the light 61 trapped within the substrate 40 towards the substrate surface with an angle of incidence suitable for out-coupling of light 65 to the environment. The shown electroluminescent device 10 comprises an encapsulation means 90, which inner side 91 is in contact to or arranged close to the counter electrode 30 supported by the spacer means 70. The encapsulation means 90 is attached to the substrate electrode 20 in a gas-tight manner, e.g. with glass frit, or glue, or metal solder, to seal the electroluminescent layer stack 50 from harmful gases such as water and/or oxygen. To prevent an electrical contact between counter electrode 30 and substrate electrode 20 via the encapsulation means (in case of occasionally or permanently contact between encapsulation means and counter electrode), the encapsulation means must have either an isolating inner side 91 or an isolation top body 95 or isolating sides 96. Alternatively, the whole encapsulation means by electrically non-conductive (=isolating).

Figure 3:
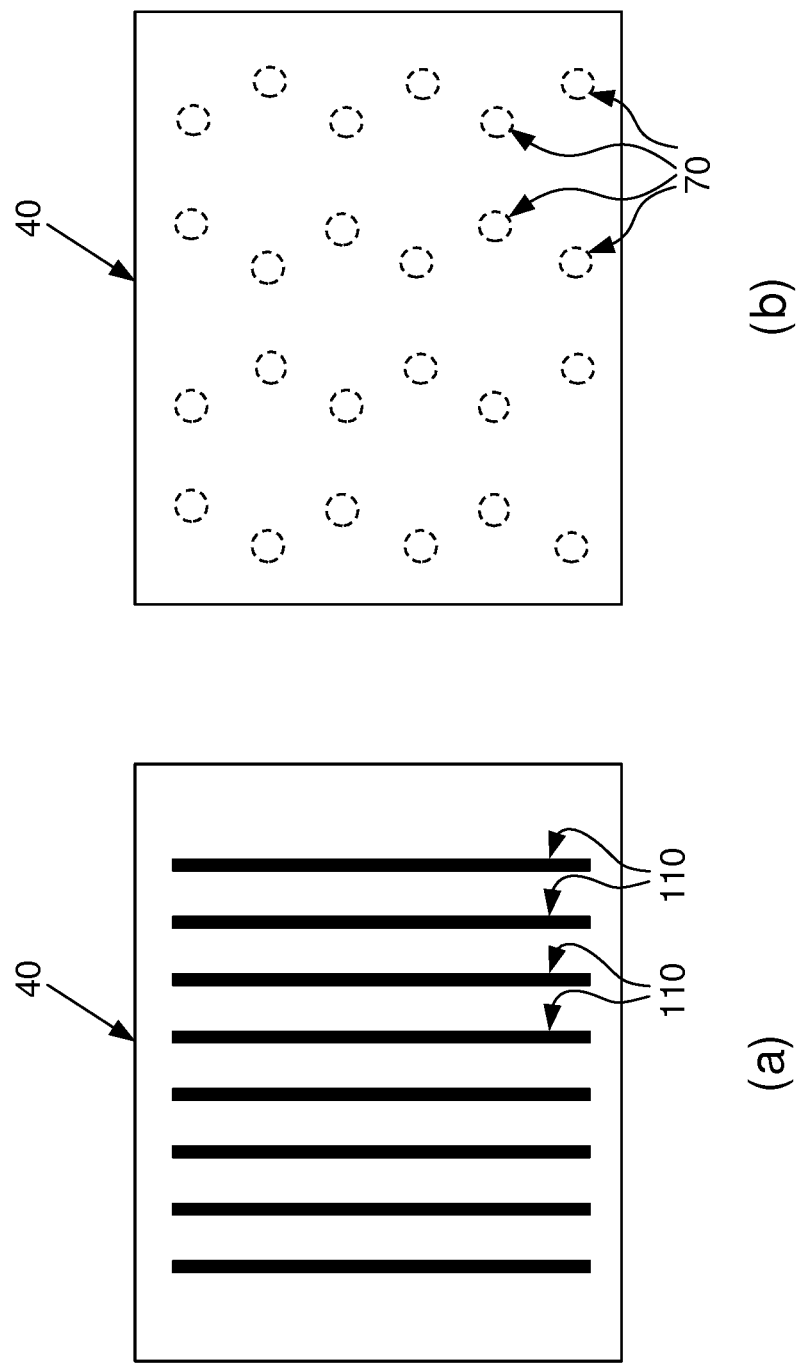
FIG. 3: front view of an electroluminescent device
(a) according to prior art and
(b) according to the present invention comprising spacer means with scattering means.

FIG. 3 shows front views of electroluminescent devices from the substrate side: (a) according to prior art and (b) according to our present invention. The spacer structure 110 covering the shunt lines of the prior art device (a) supports the encapsulation means on the backside of the device (not shown here), but the spacer structure 110 is visible to a viewer through the substrate 40 as black lines 110. In contrast to prior art, the electroluminescent device (b) according to the present invention provides an appearance with almost homogeneous brightness. The spacer means 70 are shown as small (dashed) circles in a hexagonal array, which is a geometry less sensitive to the human eye. The dashes circles shall indicate the less visibility of the spacer means 70, in case of carefully adapted scattering properties the non-visibility of the spacer means 70. As an example, an array of spacer means 70 were made of a two-component epoxy glue (UHU plus schnellfest, curing time 5 min) The binder of the glue was mixed with $TiO_2$ scattering particles as the scattering means, leading to a white substance. The binder and the hardener were mixed in the prescribed ratio of 1:1 and then applied at room temperature to the ITO-covered glass substrate in one spot. Then the substrate was heated on a hot plate to 60° C. for 15 min, which allowed the glue first to flow into a smooth hill and then to solidify rapidly. The procedure was carried out in a glove box in dry Nitrogen atmosphere (less than 1 ppm of water). The substrate with the hardened spacer means 70 was then introduced into a vacuum chamber and the electroluminescent layer stack 50 and the counter electrode 30 were deposited. The finished device was then encapsulated with a glass cover lid 90. A getter for water may be placed in the cavity formed by the substrate 40 and the lid 90. After setting of all glues (appr. 1 hour), the electroluminescent device was reliably driven. The electroluminescent layer stack 50 and the counter electrode 30 made of Aluminum covered the spacer means without cracks or holes. At the position of the spacer means, a light emission due to the scattering of the light guided in the substrate by the $TiO_2$ particles embedded in the glue made the spacer means almost invisible compared to the emitting areas not covered by spacer means 70. The resulting electroluminescent device was not sensitive to forces applied to the cover lid supported by the spacer means 70.

The brightness of the areas 71 covered by spacer means 70 can be adapted by choosing suitable scattering materials (reflectivity, refractive index) added to the spacer means 70 as particles and/or flakes, suitable amount and size of such particles and/or flakes. To further enhance the scattering effect, the substrate may comprise additional scattering means above the spacer means. People skilled in the art are able to select suitable particle and/or flake concentration and their corresponding sizes in order to adapt the brightness of the areas covered by the spacer means to the desired value, preferably to a brightness equal to the brightness of the surrounding areas of the electroluminescent device making the spacer means invisible to the viewer within the scope of this invention.

Figure 4:
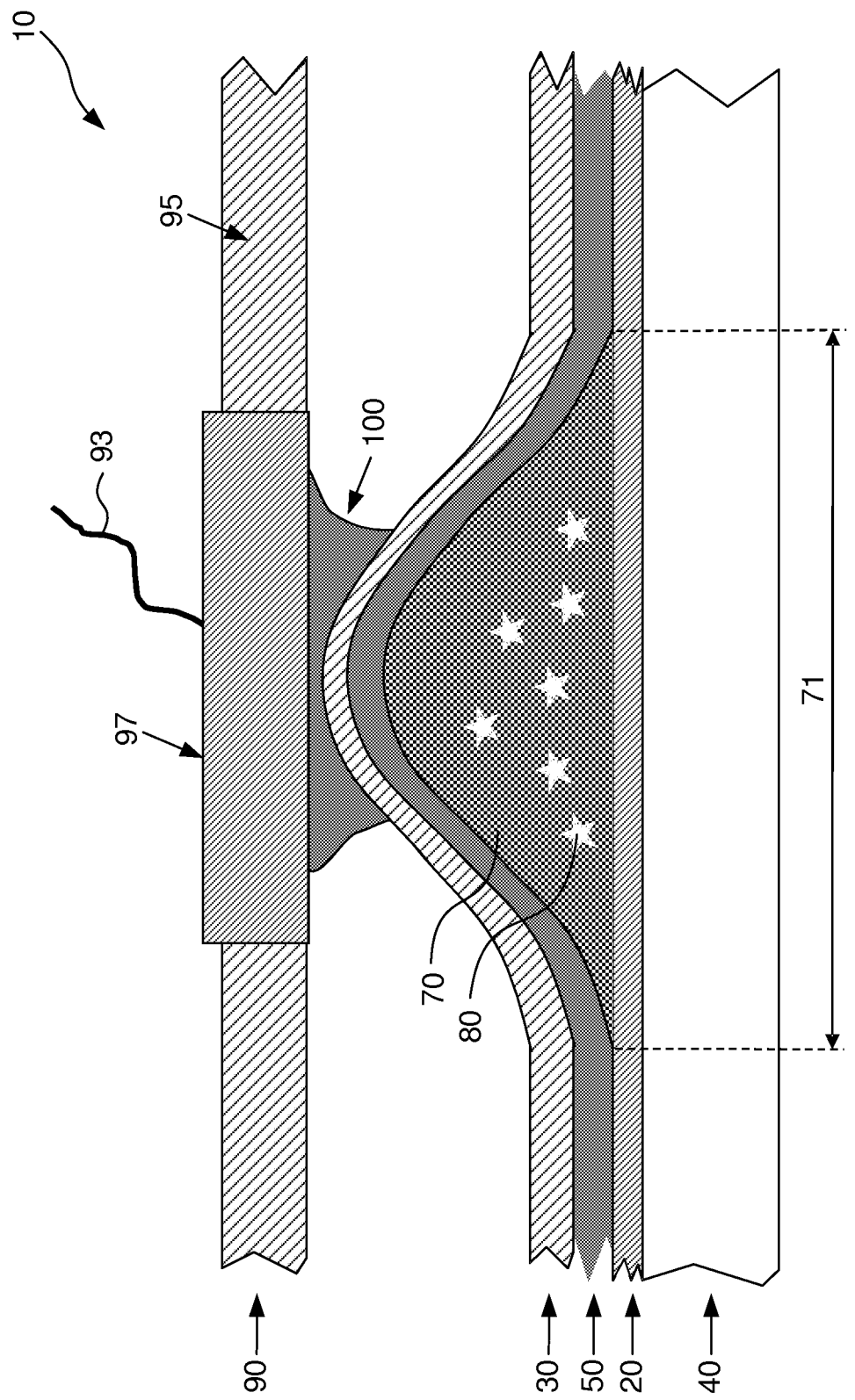
FIG. 4: a side view of the electroluminescent device according to the invention with contact means to be connected to a power source via the encapsulation means.

FIG. 4 shows the electroluminescent device according to the present invention as shown in FIG. 1 with additional conductive glue as the contact means 100 on top of the counter electrode 30 covering an area fully above the area 71 of the spacer means 70 providing an electrical connection between the counter electrode 30 and a conductive part 97 within the top 95 of the encapsulation means 90 further connected to a power source via a connection 93. In this embodiment, the contact means 100 is directly connected to the conductive part 97 of the encapsulation means 90. The conductive part 97 is one example of possible electrical feed through providing an electrical connection from a power source through the encapsulation means to the counter electrode. Alternatively, there may be a wire feed through electrically isolated against the top 95 of the encapsulation means. Alternatively the top 95 of the encapsulation 90 may be completely conductive and isolated against the substrate electrode via a non-conductive side 96 of the encapsulation means 90. In this embodiment, a conductive part 97 as shown in FIG. 4 is not required. The contact means may also be in a non-direct contact to the encapsulation means via conductive springs, arc-shaped springs, rounded tips, pins or combinations thereof.

As an example, conductive glue (Circuitsworks conductive epoxy CW2400 from Chemtronics Inc.) can be applied though a hole in the encapsulation means 90 to the counter electrode 20 at the position of the spacer means 70 and a metal plate 97 was attached with two component epoxy to the top 95 of the encapsulation means 90, closing the hole in the encapsulation means 70 in such a way that the side of the metal plate 97 facing towards the counter electrode 30 is at least partly covered by the conductive glue 100. After setting of all glues (approximately 1 hour), the OLED was reliably driven by connecting the plus lead of a power supply to the rim of the substrate where the substrate electrode was exposed and the minus lead to the metal plate 97 on the encapsulation means 90.

The described embodiments comprise as an example one organic electroluminescent layer 50 within the electroluminescent layer stack 50. In alternative embodiments within the scope of this invention, the electroluminescent layer stack may comprise additional layers such as hole transport layers, hole blocking layers, electron transport layers, electron blocking layers, charge injection layers further conducting layers etc.

LIST OF NUMERALS 10 electroluminescent device
20 substrate electrode
30 counter electrode
40 substrate
50 electroluminescent layer stack
60 light emitted from areas non-covered by spacer means
61 light trapped within the substrate 65 light emitted from areas covered by spacer means
70 spacer means
71 area covered by spacer means
72 height of spacer means
75 force applied to encapsulation means
80 scattering means
90 encapsulation means
91 inner side of the encapsulation means
92 height of encapsulation means above the substrate electrode
93 connection to power source
95 top of encapsulation means
96 side of encapsulation means
97 electrical feed through
100 contact means
110 spacer lines according to prior art

The invention claimed is:

1. An electroluminescent device comprising a substrate and on top of the substrate a substrate electrode, a counter electrode and an electroluminescent layer stack with at least one organic electroluminescent layer arranged between the substrate electrode and the counter electrode, an encapsulation means encapsulating at least the electroluminescent layer stack and at least one non-conductive spacer means arranged on the substrate electrode to mechanically support the encapsulation means and to prevent an electrical short between the substrate electrode and the counter electrode during the mechanical support, wherein the spacer means comprise at least one light scattering means that is dispersed within the spacer means and wherein the spacer means functions to enhance output, from the device, of light trapped in the substrate by scattering at least a portion of the light trapped in the substrate with said scattering means.

2. The electroluminescent device according to claim 1, wherein the sum of all areas covered by the spacer means on top of the substrate electrode is less than 10% of the area covered by the electroluminescent layer stack.

3. The electroluminescent device according to claim 1, wherein the largest extension of the area covered by the spacer means is less than 10% of each of the lateral extensions of the area covered by the electroluminescent layer stack.

4. The electroluminescent device according to claim 1, wherein the electroluminescent device comprises an array of spacer means.

5. The electroluminescent device according to claim 1, wherein the spacer means has a height ranging between 5 and 1000 micrometer.

6. The electroluminescent device according to claim 5, wherein the height of the spacer means is adapted to be essentially the same as the distance between the counter electrode and the inner side of the encapsulation means as present outside the area covered with spacer means.

7. The electroluminescent device according to claim 1, wherein the spacer means comprises at least one of the following materials: non-conductive glue, a photo resist, a lacquer, paint or a layer of glass, made of re-melted glass frit or combinations thereof.

8. Electroluminescent device according to claim 7, wherein the non-conductive glue of the spacer means is anhydrous and/or water free.

9. The electroluminescent device according to claim 1, wherein the space means has a shape suitable to prevent the emergence of a shadowing edge on a substrate electrode.

10. The electroluminesce device according to claim 1, wherein the scattering means are pigments and/or flakes and/or particles embedded in the spacer means.

11. The electroluminescent device according to claim 1, wherein at least one electrically conductive contact means is arranged on top of the counter electrode covering an area fully above the area of the spacer means suitable to provide an electrical connection between the counter electrode and a power source through the encapsulation means, which is partly conductive or comprises at least one electrical feed through suitable to connect the counter electrode with the power source.

12. The electroluminescent device according to claim 11, wherein the contact means is at least one element of the group of conductive glue, spring, arc-shaped spring, rounded tip, pin or combinations thereof.

* * * * *